US011749578B2

(12) United States Patent
Takahashi et al.

(10) Patent No.: US 11,749,578 B2
(45) Date of Patent: Sep. 5, 2023

(54) SEMICONDUCTOR MODULE, POWER SEMICONDUCTOR MODULE, AND POWER ELECTRONIC EQUIPMENT USING THE SEMICONDUCTOR MODULE OR THE POWER SEMICONDUCTOR MODULE

(71) Applicant: PANASONIC INTELLECTUAL PROPERTY MANAGEMENT CO., LTD., Osaka (JP)

(72) Inventors: Koji Takahashi, Osaka (JP); Kazuhiro Yahata, Osaka (JP); Yoshihisa Minami, Shiga (JP); Hiroki Akashi, Osaka (JP); Shinya Miyazaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 207 days.

(21) Appl. No.: 17/431,657

(22) PCT Filed: Jan. 14, 2020

(86) PCT No.: PCT/JP2020/000792
§ 371 (c)(1),
(2) Date: Aug. 17, 2021

(87) PCT Pub. No.: WO2020/170650
PCT Pub. Date: Aug. 27, 2020

(65) Prior Publication Data
US 2022/0139797 A1 May 5, 2022

(30) Foreign Application Priority Data
Feb. 22, 2019 (JP) ................... 2019-030828

(51) Int. Cl.
*H01L 23/367* (2006.01)
*H01L 23/00* (2006.01)
*H01L 25/065* (2023.01)

(52) U.S. Cl.
CPC .......... *H01L 23/3672* (2013.01); *H01L 24/05* (2013.01); *H01L 24/09* (2013.01);
(Continued)

(58) Field of Classification Search
CPC ..... H01L 23/3672; H01L 24/05; H01L 24/09; H01L 24/45; H01L 24/48; H01L 24/85; H01L 25/0655; H01L 25/072
See application file for complete search history.

(56) References Cited

U.S. PATENT DOCUMENTS 9,640,471 B2    5/2017 Kinzer
2015/0216035 A1*  7/2015 Uno .................. H05K 1/18
                                                  361/783
2017/0077012 A1*  3/2017 Kosaka ................ H01L 23/66

FOREIGN PATENT DOCUMENTS

JP      2017-059650 A    3/2017

OTHER PUBLICATIONS

International Search Report and Written Opinion dated Apr. 14, 2020 in International Patent Application No. PCT/JP2020/000792; with partial English translation.

* cited by examiner

*Primary Examiner* — Marc Anthony Armand
(74) *Attorney, Agent, or Firm* — McDermott Will & Emery LLP

(57) ABSTRACT

The semiconductor module includes: a heat dissipation board including first to third wiring patterns; a first metal plate on the first wiring pattern, a second metal plate on the second wiring pattern, a first semiconductor chip and a first intermediate board which are on the first metal plate, a
(Continued)

second semiconductor chip and a second intermediate board which are on the second metal plate. A first metal film on the first intermediate board is electrically connected to the first semiconductor chip and the second metal plate, and a second metal film on the second intermediate board is electrically connected to the second semiconductor chip and the third wiring pattern.

25 Claims, 11 Drawing Sheets

(52) U.S. Cl.
CPC .............. *H01L 24/45* (2013.01); *H01L 24/48* (2013.01); *H01L 25/0655* (2013.01); *H01L 2224/04042* (2013.01); *H01L 2224/05144* (2013.01); *H01L 2224/09515* (2013.01); *H01L 2224/45144* (2013.01); *H01L 2224/48155* (2013.01); *H01L 2924/014* (2013.01); *H01L 2924/13091* (2013.01); *H01L 2924/30107* (2013.01)

SEMICONDUCTOR MODULE, POWER SEMICONDUCTOR MODULE, AND POWER ELECTRONIC EQUIPMENT USING THE SEMICONDUCTOR MODULE OR THE POWER SEMICONDUCTOR MODULE

CROSS-REFERENCE OF RELATED APPLICATIONS

This application is the U.S. National Phase under 35 U.S.C. § 371 of International Patent Application No. PCT/JP2020/000792, filed on Jan. 14, 2020, which in turn claims the benefit of Japanese Application No. 2019-030828, filed on Feb. 22, 2019, the entire disclosures of which applications are incorporated by reference herein.

TECHNICAL FIELD

The present invention relates to a semiconductor module for power electronic applications and power electronic equipment using the same.

BACKGROUND ART

In recent years, power semiconductor transistors used in the field of power electronics have been replaced with conventional metal-oxide-semiconductor (MOS) type semiconductor transistors, and semiconductor transistors which are small and capable of high-speed switching such as gallium nitride (hereinafter referred to as GaN) and the like are attracting attention. In a semiconductor module in which such a semiconductor transistor chip, a chip having a drive circuit for driving the semiconductor transistor and the like are integrated, improvement of heat dissipation and improvement of high frequency characteristics are required.

As shown in FIG. 7, In the configuration of a semiconductor module for conventional power electronic applications, as shown in FIG. 7, three power wiring patterns of first wiring pattern 2, second wiring pattern 3, and third wiring pattern 4 are included on insulating substrate 1, first semiconductor chip Q1 for the low side (hereinafter referred to as LS) is mounted on first wiring pattern 2, and second semiconductor chip Q2 for the high side (hereinafter referred to as HS) is mounted on second wiring pattern 3. In addition, the configuration in which the electrical connection between first semiconductor chip Q1 and second semiconductor chip Q2 forming the output of the half bridge circuit in FIG. 9 (hereinafter referred to as HB output) is made by wire 5 from first semiconductor chip Q1 to second semiconductor chip Q2 is widely used (see, for example, Patent Literature (PTL) 1). It should be noted that in this specification, "electrical connection" is also simply referred to as "connection".

On the other hand, as a semiconductor package that suppresses wire fusing, as shown in FIG. 8, semiconductor chip 7, conductive plates 8, 9, and intermediate boards 10, 11 are mounted on conductive plate 6. Then, a method of relaying wire 12 and wire 13 by intermediate board 10 and relaying wire 14 and wire 15 by intermediate board 11 is disclosed (see, for example, PTL 2).

CITATION LIST

Patent Literature

[PTL 1] U.S. Pat. No. 9,640,471
[PTL 2] Japanese Unexamined Patent Application Publication No. 2017-59650

SUMMARY OF INVENTION

Technical Problem

However, in the configuration of the conventional semiconductor module, first semiconductor chip Q1 is arranged on first wiring pattern 2 which is on insulating board 1, and second semiconductor chip Q2 is arranged on second wiring pattern 3, so that there is a problem that the heat diffusion of the semiconductor chip is insufficient and the heat dissipation characteristics are not satisfied in order to apply the configuration of the conventional semiconductor module to a small GaN transistor and to operate the semiconductor chip with high power and high speed (for example, 13.56 MHz or more). Furthermore, in the conventional configuration, the electrical connection between first semiconductor chip Q1 and second semiconductor chip Q2 of the half bridge circuit is made by long wire 5 from first semiconductor chip Q1 to second semiconductor chip Q2, so that there is also a problem that the parasitic inductor is large and the high frequency characteristics cannot be satisfied.

Therefore, an object of the present invention is to provide a semiconductor module, a power semiconductor module, and power electronic equipment using them, which can secure higher heat dissipation and better high frequency characteristics without increasing the area of the semiconductor chip.

Solution to Problem

In order to achieve the above object, one form of the semiconductor module in the present invention includes: a heat dissipation board that is insulating and includes, on an upper surface of the heat dissipation board, at least a first wiring pattern, a second wiring pattern, and a third wiring pattern each of which is a conductor layer; a first metal plate that is bonded onto the first wiring pattern; a second metal plate that is bonded onto the second wiring pattern; a first semiconductor chip and a first intermediate board that are bonded onto the first metal plate; and a second semiconductor chip and a second intermediate board that are bonded onto the second metal plate, wherein a first metal film electrically insulated from the first metal plate is disposed on an upper surface of the first intermediate board, a second metal film electrically insulated from the second metal plate is disposed on an upper surface of the second intermediate board, at least one first drain electrode pad of the first semiconductor chip is connected to the first metal film disposed on the upper surface of the first intermediate board by a plurality of first wires, at least one second drain electrode pad of the second semiconductor chip is connected to the second metal film disposed on the upper surface of the second intermediate board by a plurality of second wires, the first metal film is connected to the second metal plate via a plurality of third wires, the second metal film is connected to the third wiring pattern via a plurality of fourth wires, and the semiconductor module configures a half bridge circuit.

In addition, in order to achieve the above object, one form of the power semiconductor module in the present invention includes: the above semiconductor module, and a cooling heat sink bonded to a lower surface of the heat dissipation board.

In addition, in order to achieve the above object, one form of the power electronic equipment in the present invention uses the above power semiconductor module.

Advantageous Effects of Invention

According to the present invention, a semiconductor module, a power semiconductor module, and power electronic equipment using either of them, which can secure higher heat dissipation and better high frequency characteristics by reducing parasitic inductors due to wire shortening without increasing the area of the semiconductor chip, are realized.

DESCRIPTION OF EMBODIMENTS

Figure 1A:
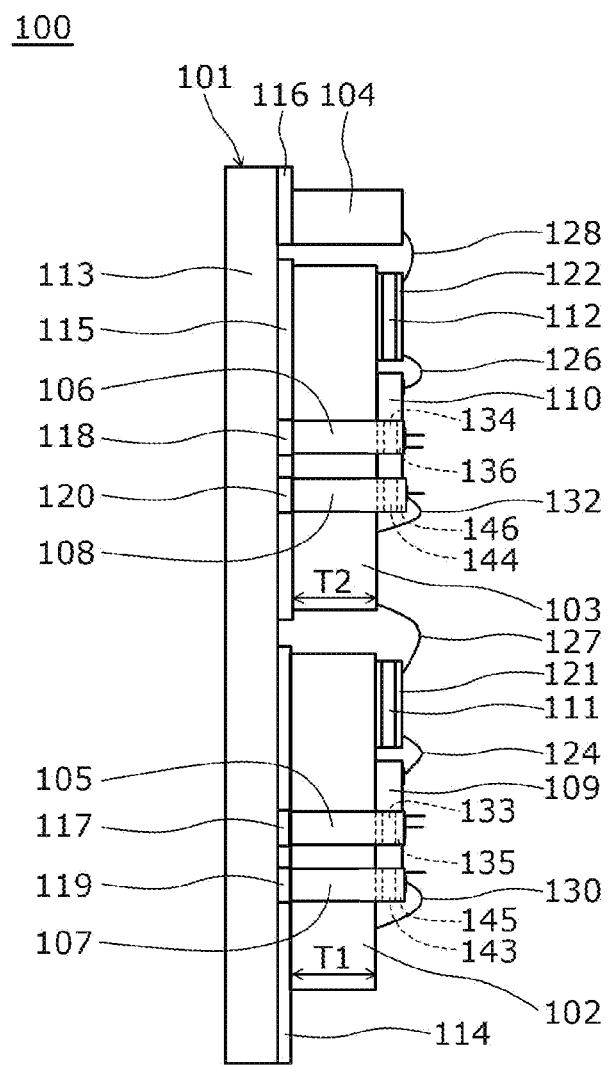
FIG. 1A is a side view of the semiconductor module according to Embodiment 1 of the present invention.

Hereinafter, embodiments of the present invention will be described in detail with reference to the drawings. However, in Embodiment 1 to Embodiment 6, the same components are designated by the same reference numerals, and duplicate description will be omitted.

Figure 7:
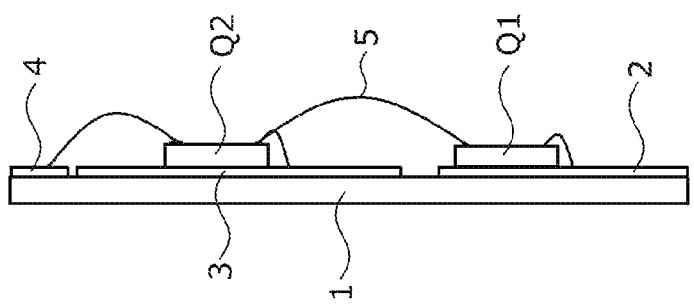
FIG. 7 is a side view of a conventional semiconductor module.
Figure 8:
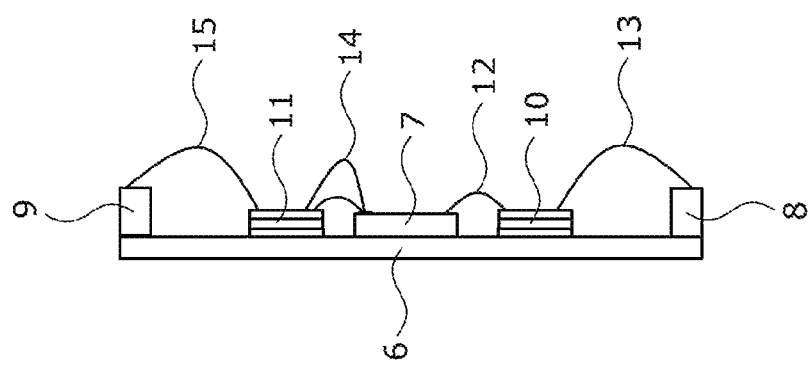
FIG. 8 is a side view of another conventional semiconductor module.
Figure 9:
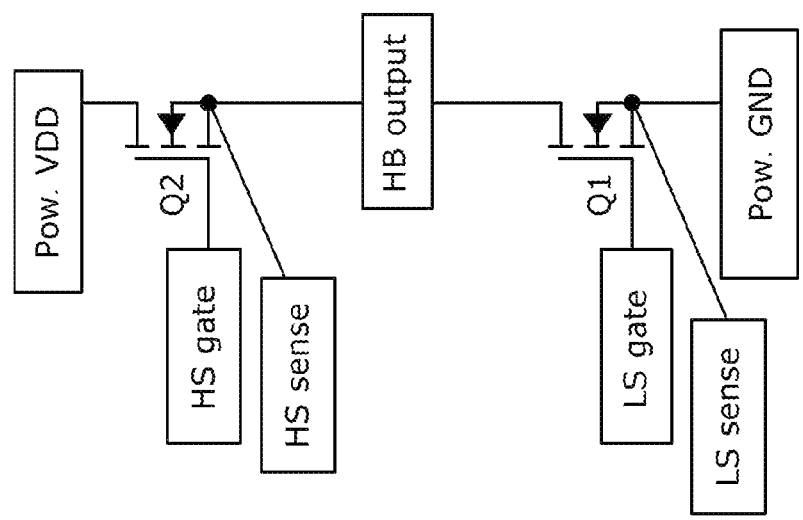
FIG. 9 is a diagram showing a general example of a half bridge circuit.

FIG. 9 is a diagram showing a general example of a half bridge circuit, and Embodiment 1, Embodiment 2, Embodiment 3 of the present invention, and the conventional semiconductor module shown in FIG. 7 configure the present circuit.

Embodiment 1

Figure 1B:
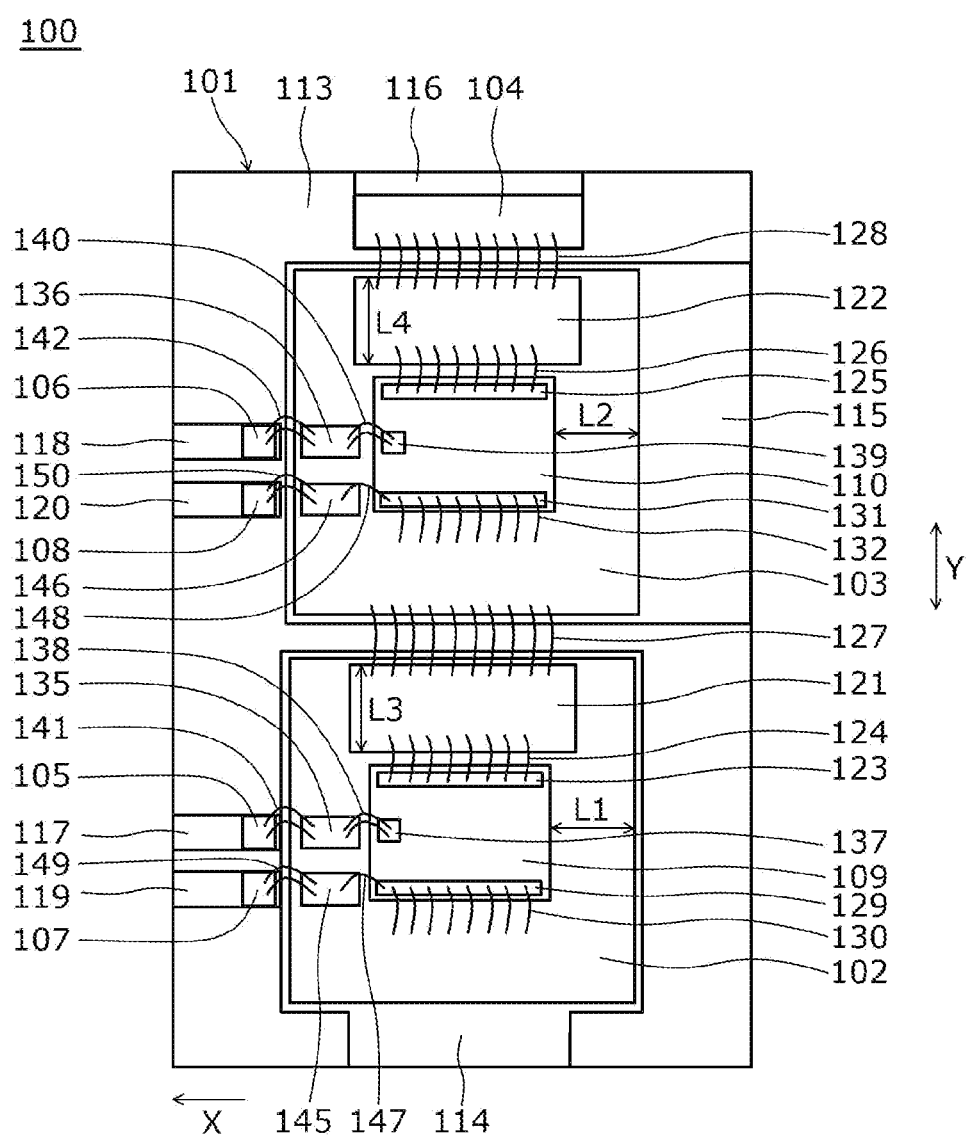
FIG. 1B is a top view of the semiconductor module according to Embodiment 1 of the present invention.

FIG. 1A is a side view of semiconductor module 100 according to Embodiment 1 of the present invention. FIG. 1B is a top view of semiconductor module 100 according to Embodiment 1 of the present invention.

With reference to FIG. 1A and FIG. 1B, semiconductor module 100 according to Embodiment 1 of the present invention includes heat dissipation board 101, first metal plate 102, second metal plate 103, third metal plate 104, fourth metal plate 105, fifth metal plate 106, sixth metal plate 107, and seventh metal plate 108. In addition, semiconductor module 100 includes first semiconductor chip 109, second semiconductor chip 110, first intermediate board 111, and second intermediate board 112.

In Embodiment 1, heat dissipation board 101 is used. Heat dissipation board 101 includes insulating board main body 113. The material of board main body 113 is not particularly limited, but AlN (aluminum nitride), SiN (silicon nitride), BeO (beryllium oxide) and the like are used from the viewpoint of heat dissipation.

In addition, heat dissipation board 101 includes first wiring pattern 114, second wiring pattern 115, third wiring pattern 116, LS gate wiring pattern 117, HS gate wiring pattern 118, LS sense wiring pattern 119, and HS sense wiring pattern 120 each of which is a conductor layer on an upper surface thereof. Specifically, onto board main body 113, first wiring pattern 114, second wiring pattern 115, and third wiring pattern 116 are bonded as the wiring pattern for the power system, and LS gate wiring pattern 117, HS gate wiring pattern 118, LS sense wiring pattern 119, and HS sense wiring pattern 120 are bonded as the wiring pattern for driving.

First metal plate 102 is bonded on first wiring pattern 114, and first semiconductor chip 109 and first intermediate board 111 are bonded onto first metal plate 102. Similarly, second metal plate 103 is bonded on second wiring pattern 115, and second semiconductor chip 110 and second intermediate board 112 are bonded onto second metal plate 103. Third metal plate 104 is bonded onto third wiring pattern 116.

First metal film 121 electrically insulated from first metal plate 102 is formed on the upper surface of first intermediate board 111, and a metal film is also formed on the lower surface of first intermediate board 111. Similarly, second metal film 122 electrically insulated from second metal plate 103 is formed on the upper surface of second intermediate board 112, and a metal film is also formed on the lower surface of second intermediate board 112.

One first drain electrode pad 123 formed on the upper surface of first semiconductor chip 109 is electrically connected to first metal film 121 by a plurality of first wires 124, and one second drain electrode pad 125 formed on the upper surface of second semiconductor chip 110 is electrically connected to second metal film 122 by a plurality of second wires 126. It should be noted that a plurality of first drain electrode pads may be formed on the upper surface of first semiconductor chip 109, and the plurality of first drain electrode pads and first metal film 121 may be electrically connected by a plurality of first wires 124. In addition, a plurality of second drain electrode pads may be formed on the upper surface of second semiconductor chip 110, and the plurality of second drain electrode pads and second metal film 122 may be electrically connected by a plurality of second wires 126.

First metal film 121 is electrically connected to second metal plate 103 via a plurality of third wires 127, and second metal film 122 is electrically connected to third wiring pattern 116 via a plurality of fourth wires 128 and third metal plate 104. The plurality of fourth wires 128 are connected to second metal film 122 and third metal plate 104.

One first source electrode pad 129 formed on the upper surface of first semiconductor chip 109 is electrically connected to first metal plate 102 by a plurality of thirteenth wires 130, and one second source electrode pad 131 formed on the upper surface of second semiconductor chip 110 is electrically connected to second metal plate 103 by a plurality of fourteenth wires 132. It should be noted that a plurality of first source electrode pads may be formed on the upper surface of first semiconductor chip 109, and the plurality of first source electrode pads and first metal plate 102 may be electrically connected by a plurality of thirteenth wires 130. In addition, a plurality of second source electrode pads may be formed on the upper surface of second semiconductor chip 110, and the plurality of second source electrode pads and second metal plate 103 may be electrically connected by a plurality of fourteenth wires 132.

Semiconductor module 100 configures a power line from the power supply (hereinafter referred to as Pow. VDD) of the half bridge circuit shown in FIG. 9 to the power ground (hereinafter referred to as Pow. GND) according to the above configuration.

Furthermore, semiconductor module 100 includes third intermediate board 133 (provided so as to overlap third metal film 135 (described later) in FIG. 1B) bonded onto first metal plate 102, and fourth intermediate board 134 (provided so as to overlap fourth metal film 136 (described later) in FIG. 1B) bonded onto second metal plate 103.

Third metal film 135 electrically insulated from first metal plate 102 is formed on the upper surface of third intermediate board 133, and a metal film is also formed on the lower surface of third intermediate board 133. In addition, fourth metal film 136 electrically insulated from second metal plate 103 is formed on the upper surface of fourth intermediate board 134, and a metal film is also formed on the lower surface of fourth intermediate board 134.

One first gate electrode pad 137 formed on the upper surface of first semiconductor chip 109 is electrically connected to third metal film 135 by a plurality of fifth wires 138, and one second gate electrode pad 139 formed on the upper surface of second semiconductor chip 110 is electrically connected to fourth metal film 136 by a plurality of sixth wires 140. It should be noted that one first gate electrode pad 137 of first semiconductor chip 109 and third metal film 135 are only needed to be electrically connected by at least one fifth wire 138. In addition, one second gate electrode pad 139 of second semiconductor chip 110 and fourth metal film 136 are only needed to be electrically connected by at least one sixth wire 140. In addition, a plurality of first gate electrode pads may be formed on the upper surface of first semiconductor chip 109, and the plurality of first gate electrode pads and third metal film 135 may be electrically connected by at least one fifth wire 138. In addition, a plurality of second gate electrode pads may be formed on the upper surface of second semiconductor chip 110, and the plurality of second gate electrode pads and fourth metal film 136 may be electrically connected by at least one sixth wire 140.

Third metal film 135 is electrically connected to fourth metal plate 105 by a plurality of seventh wires 141, and fourth metal film 136 is electrically connected to fifth metal plate 106 by a plurality of eighth wires 142. It should be noted that third metal film 135 and fourth metal plate 105 are only needed to be electrically connected by at least one seventh wire 141. In addition, fourth metal film 136 and fifth metal plate 106 are only needed to be electrically connected by at least one eighth wire 142.

Fourth metal plate 105 is connected to LS gate wiring pattern 117 on the upper surface of heat dissipation board 101, and fifth metal plate 106 is connected to HS gate wiring pattern 118 on the upper surface of heat dissipation board 101.

In this way, the plurality of fifth wires 138 connected from first gate electrode pad 137 of first semiconductor chip 109 are electrically connected to LS gate wiring pattern 117 on the upper surface of heat dissipation board 101 via third metal film 135, seventh wire 141, and fourth metal plate 105. In addition, the plurality of sixth wires 140 connected from second gate electrode pad 139 of second semiconductor chip 110 are electrically connected to HS gate wiring pattern 118 on the upper surface of heat dissipation board 101 via fourth metal film 136, eighth wire 142, and fifth metal plate 106.

Semiconductor module 100 configures the LS and HS gate control lines of the half bridge circuit shown in FIG. 9 according to the above configuration.

Fourth metal plate 105 is arranged in the direction (arrow X direction in FIG. 1B) in which a distance from an end of first metal plate 102 to first gate electrode pad 137 of first semiconductor chip 109 that is to be electrically connected is shortest when seen from first gate electrode pad 137. Furthermore, fifth metal plate 106 is arranged in the direction (arrow X direction in FIG. 1B) in which a distance from an end of second metal plate 103 to second gate electrode pad 139 of second semiconductor chip 110 that is to be electrically connected is shortest when seen from second gate electrode pad 139. By arranging in this way, the parasitic inductance of the gate control lines can be significantly reduced.

Furthermore, semiconductor module 100 includes fifth intermediate board 143 (provided so as to overlap fifth metal film 145 (described later) in FIG. 1B) bonded onto first metal plate 102, and sixth intermediate board 144 (provided so as to overlap sixth metal film 146 (described later) in FIG. 1B) bonded onto second metal plate 103.

Fifth metal film 145 electrically insulated from first metal plate 102 is formed on the upper surface of fifth intermediate board 143, and a metal film is also formed on the lower surface of fifth intermediate board 143. In addition, sixth metal film 146 electrically insulated from second metal plate 103 is formed on the upper surface of sixth intermediate board 144, and a metal film is also formed on the lower surface of sixth intermediate board 144.

One first source electrode pad 129 formed on the upper surface of first semiconductor chip 109 is electrically connected to fifth metal film 145 by one ninth wire 147, and one second source electrode pad 131 formed on the upper surface of second semiconductor chip 110 is electrically connected to sixth metal film 146 by one tenth wire 148. It should be noted that one first source electrode pad 129 of first semiconductor chip 109 and fifth metal film 145 are only needed to be electrically connected by at least one ninth wire 147. In addition, one second source electrode pad 131 of second semiconductor chip 110 and sixth metal film 146 are only needed to be electrically connected by at least one tenth wire 148. In addition, a plurality of first source electrode pads may be formed on the upper surface of first semiconductor chip 109, and the plurality of first source electrode pads and fifth metal film 145 may be electrically connected by at least one ninth wire 147. In addition, a plurality of second source electrode pads may be formed on the upper surface of second semiconductor chip 110, and the plurality of second source electrode pads and sixth metal film 146 may be electrically connected by at least one tenth wire 148.

Fifth metal film 145 is electrically connected to sixth metal plate 107 by a plurality of eleventh wires 149, and sixth metal film 146 is electrically connected to seventh metal plate 108 by a plurality of twelfth wires 150. It should be noted that fifth metal film 145 and sixth metal plate 107 are only needed to be electrically connected by at least one eleventh wire 149. In addition, sixth metal film 146 and seventh metal plate 108 are only needed to be electrically connected by at least one twelfth wire 150.

Sixth metal plate 107 is connected to LS sense wiring pattern 119 on the upper surface of heat dissipation board 101, and seventh metal plate 108 is connected to HS sense wiring pattern 120 on the upper surface of heat dissipation board 101.

In this way, one ninth wire 147 connected from first source electrode pad 129 of first semiconductor chip 109 is electrically connected to LS sense wiring pattern 119 on the upper surface of heat dissipation board 101 via fifth metal film 145, eleventh wires 149, and sixth metal plate 107. In addition, one tenth wire 148 connected from second source electrode pad 131 of second semiconductor chip 110 is electrically connected to HS sense wiring pattern 120 on the upper surface of heat dissipation board 101 via sixth metal film 146, twelfth wires 150, and seventh metal plate 108.

Semiconductor module 100 configures the LS and HS sense lines of the half bridge circuit shown in FIG. 9 according to the above configuration.

Sixth metal plate 107 is arranged in the direction (arrow X direction in FIG. 1B) in which a distance from an end of first metal plate 102 to first source electrode pad 129 of first semiconductor chip 109 that is to be electrically connected is shortest when seen from first source electrode pad 129. Furthermore, seventh metal plate 108 is arranged in the direction (arrow X direction in FIG. 1B) in which a distance from an end of second metal plate 103 to second source electrode pad 131 of second semiconductor chip 110 that is to be electrically connected is shortest when seen from second source electrode pad 131. By doing so, the parasitic inductance of the sense lines can be significantly reduced.

It should be noted that although it is described in the drawing with the minimum necessary wiring pattern, a plurality of terminals with the same terminal name may exist as a semiconductor module.

As described above, semiconductor module 100 according to Embodiment 1 includes: heat dissipation board 101 that is insulating and includes, on an upper surface of the heat dissipation board 101, first wiring pattern 114, second wiring pattern 115, and third wiring pattern 116 each of which is a conductor layer; first metal plate 102 that is bonded onto first wiring pattern 114; second metal plate 103 that is bonded onto second wiring pattern 115; first semiconductor chip 109 and first intermediate board 111 that are bonded onto first metal plate 102; and second semiconductor chip 110 and second intermediate board 112 that are bonded onto second metal plate 103, wherein first metal film 121 electrically insulated from first metal plate 102 is disposed on an upper surface of first intermediate board 111, second metal film 122 electrically insulated from second metal plate 103 is disposed on an upper surface of second intermediate board 112, one first drain electrode pad 123 of first semiconductor chip 109 is connected to first metal film 121 disposed on the upper surface of first intermediate board 111 by a plurality of first wires 124, one second drain electrode pad 125 of second semiconductor chip 110 is connected to second metal film 122 disposed on the upper surface of second intermediate board 112 by a plurality of second wires 126, first metal film 121 is electrically connected to second metal plate 103 via a plurality of third wires 127, second metal film 122 is electrically connected to third wiring pattern 116 via a plurality of fourth wires 128, and the semiconductor module configures a half bridge circuit.

With this, in order to improve the heat dissipation characteristics, first metal plate 102, which is a thick metal plate for heat dissipation, is inserted between first wiring pattern 114 on the upper surface of heat dissipation board 101 and first semiconductor chip 109, and similarly, second metal plate 103 is inserted between the connection between second wiring pattern 115 and second semiconductor chip 110. Therefore, the heat generated from first semiconductor chip 109 and second semiconductor chip 110 can be diffused and efficiently dissipated without increasing the areas of first semiconductor chip 109 and second semiconductor chip 110. In addition, by providing first intermediate board 111 and second intermediate board 112, the lengths of first wire 124, second wire 126, third wire 127, and fourth wire 128 can be shortened. Therefore, the parasitic inductance can be reduced and good high frequency characteristics can be ensured.

In order to efficiently diffuse heat, heat diffusion of 45° or more in the direction from the end of the mounted chip toward the bottom surface is required for the thickness (T1) of first metal plate 102 and the thickness (T2) of second metal plate 103 according to the heat dissipation specifications. For that reason, it is preferable that the relationship between the shortest distance (L1) from the end of first semiconductor chip 109 to the end of first metal plate 102 and the thickness (T1) of first metal plate 102 is L1>T1, and the relationship between the shortest distance (L2) from the end of second semiconductor chip 110 to the end of second metal plate 103 and the thickness (T2) of second metal plate 103 is L2>T2.

In addition, as another method for improving heat dissipation, it is desirable to use AuSn (gold tin), which is a solder material with good heat dissipation, for bonding between first metal plate 102 for heat dissipation and first wiring pattern 114, and for bonding between first metal plate 102 and first semiconductor chip 109 or the like (component which is bonded to first metal plate 102), and it is preferable to use the same solder material for bonding in the same layer in order to unify the manufacturing flow. The same is also true for bonding between second metal plate 103 and second wiring pattern 115, and bonding between second metal plate 103 and second semiconductor chip 110 or the like (component which is bonded to second metal plate 103).

Furthermore, in order to improve the high frequency characteristics, it is necessary to reduce the inductor component and capacitance component added to the power line of the half bridge circuit.

In order to reduce the parasitic inductor component, it is important to connect the wires in parallel and shorten the wires. In Embodiment 1 of the present invention, by providing first intermediate board 111, third intermediate board 133, and fifth intermediate board 143 on first metal plate 102 for heat dissipation, and providing second intermediate board 112, fourth intermediate board 134, and sixth intermediate board 144 on second metal plate 103, first to twelfth wires 124, 126, 127, 128, 138, 140, 141, 142, 147, 148, 149, 150 are shortened.

Regarding the width of the intermediate board in the wire extension direction, it is desirable that first semiconductor chip 109 and the first intermediate board are brought closer to each other, and second semiconductor chip 110 and second intermediate board 112 are brought closer to each other by setting the maximum width (L3) of first intermediate board 111 in the extension direction of first wire 124 and third wire 127 in a plan view (arrow Y direction in FIG. 1B) to be larger than the thickness (T1) of first metal plate 102, and setting the maximum width (L4) of second intermediate board 112 in the extension direction (arrow Y direction in FIG. 1B) of second wire 126 and fourth wire 128 in a plan view to be larger than the thickness (T2) of second metal plate 103, in order to shorten the wires as much as possible.

In addition, as a further shortening of the wire, it is characterized in that third metal plate 104 on third wiring pattern 116 is used in order to avoid increasing the length of fourth wire 128 due to the connection from second metal film 122 formed on the upper surface of second intermediate board 112 to third wiring pattern 116 on the upper surface of heat dissipation board 101 being downhill. By doing so, the start point and the end point of the wire bonding become substantially in the same height, and the height difference of fourth wire 128 can be reduced. It is only needed that the specific height of third metal plate 104 is greater than the thickness (T2) of second metal plate 103, and is less than the sum of the thickness (T2) of second metal plate 103 and twice a thickness of second intermediate board 112.

In order to reduce the wire height difference, it is desirable that the thickness of first semiconductor chip 109 is equal to the sum of the thicknesses of first intermediate board 111 and first metal film 121, and the thickness of second semiconductor chip 110 is equal to the sum of the thicknesses of second intermediate board 112 and second metal film 122. However, since the actual thicknesses of first semiconductor chip 109 and second semiconductor chip 110 are sufficiently small at a maximum of several hundred μm, third wire 127 that connects first metal film 121 on first intermediate board 111 to second metal plate 103 may be connected directly.

In addition, the bonding pads of first semiconductor chip 109 and second semiconductor chip 110 are designed so as not to take larger areas because parasitic capacitance per unit area increases compared to first intermediate board 111 and second intermediate board 112. On the other hand, since first intermediate board 111 and second intermediate board 112 have a lower parasitic capacitance than first semiconductor chip 109 and second semiconductor chip 110, they can take large areas. Therefore, regarding the number of wires, it is preferable that the total number of third wires 127 is larger than the total number of first wires 124 and the total number of fourth wires 128 is larger than the total number of second wires 126. By doing so, the parasitic inductor can be reduced.

In addition, in order to reduce the capacitance component added to the power line, it is desirable to use a semiconductor chip having as a small size as possible to reduce the parasitic capacitance (for example, Coss and the like) inside the semiconductor chip. For that purpose, a chip using a horizontal device, in which the channel (not shown) of first semiconductor chip 109 extends parallel to the substrate (not shown) of first semiconductor chip 109, and the channel (not shown) of second semiconductor chip 110 extends parallel to the substrate (not shown) of second semiconductor chip 110, is preferable because the Cos is small. Here, the channel of first semiconductor chip 109 refers to a passage of electric current formed on the substrate of first semiconductor chip 109 when a voltage is applied to first gate electrode pad 137. In addition, the channel of second semiconductor chip 110 refers to a passage of electric current formed on the substrate of second semiconductor chip 110 when a voltage is applied to second gate electrode pad 139. In particular, as a horizontal device, a GaN transistor having excellent high frequency characteristics and a small chip size is preferable. In the GaN transistor, when a conductive Si board is used, the Si board is set to the source potential in order to increase the switching speed. Therefore, the modular structure of the present configuration is suitable.

Furthermore, it is desirable that the parasitic capacitance generated from the upper layer to the lower layer of first intermediate board 111 is smaller than the parasitic capacitance of first semiconductor chip 109, and the parasitic capacitance generated from the upper layer to the lower layer of second intermediate board 112 is smaller than the parasitic capacitance of second semiconductor chip 110, and in order to do so, the following relationships need to be satisfied.

[Math. 1]

$$\varepsilon i1/di1 < \varepsilon s1/ds1 \quad \text{(Formula 1)}$$

and $$\varepsilon i2/di2 < \varepsilon s2/ds2 \quad \text{(Formula 2)}$$

where dielectric constant $\varepsilon i1$ of the insulator included in first intermediate board 111 is lower than dielectric constant $\varepsilon s1$ of the substrate of first semiconductor chip 109; dielectric constant $\varepsilon i2$ of the insulator included in second intermediate board 112 is lower than dielectric constant $\varepsilon s2$ of the substrate of second semiconductor chip 110; $di1$ denotes the thickness of first intermediate board 111; $di2$ denotes the thickness of second intermediate board 112; $ds1$ denotes the thickness of first semiconductor chip 109; and $ds2$ denotes the thickness of second semiconductor chip 110.

Since the electrical connection relationship from each electrode pad of first semiconductor chip 109 and second semiconductor chip 110 to LS gate wiring pattern 117, HS gate wiring pattern 118, LS sense wiring pattern 119, and HS sense wiring pattern 120 is in the same inventive concept as that of the power line described above, the description will be omitted.

It should be noted that since the material of first to twelfth wires 124, 126, 127, 128, 138, 140, 141, 142, 147, 148, 149, and 150 is gold with low resistance, the power loss can be reduced. In addition, by using gold for all the wires, it is possible to suppress the occurrence of reliability problems such as purple plague.

In addition, for the same reason of reliability, the material of the upper surfaces of first drain electrode pad 123, first gate electrode pad 137, and first source electrode pad 129 of first semiconductor chip 109, and second drain electrode pad 125, second gate electrode pad 139, and second source electrode pad 131 of second semiconductor chip 110 is preferably gold.

Furthermore, for the same reason of reliability, the material of the upper surfaces of first to seventh metal plates 102, 103, 104, 105, 106, 107, and 108 and the material of the upper surfaces of first to sixth metal films 121, 122, 135, 136, 145, and 146 are preferably gold.

Embodiment 2

Figure 2:
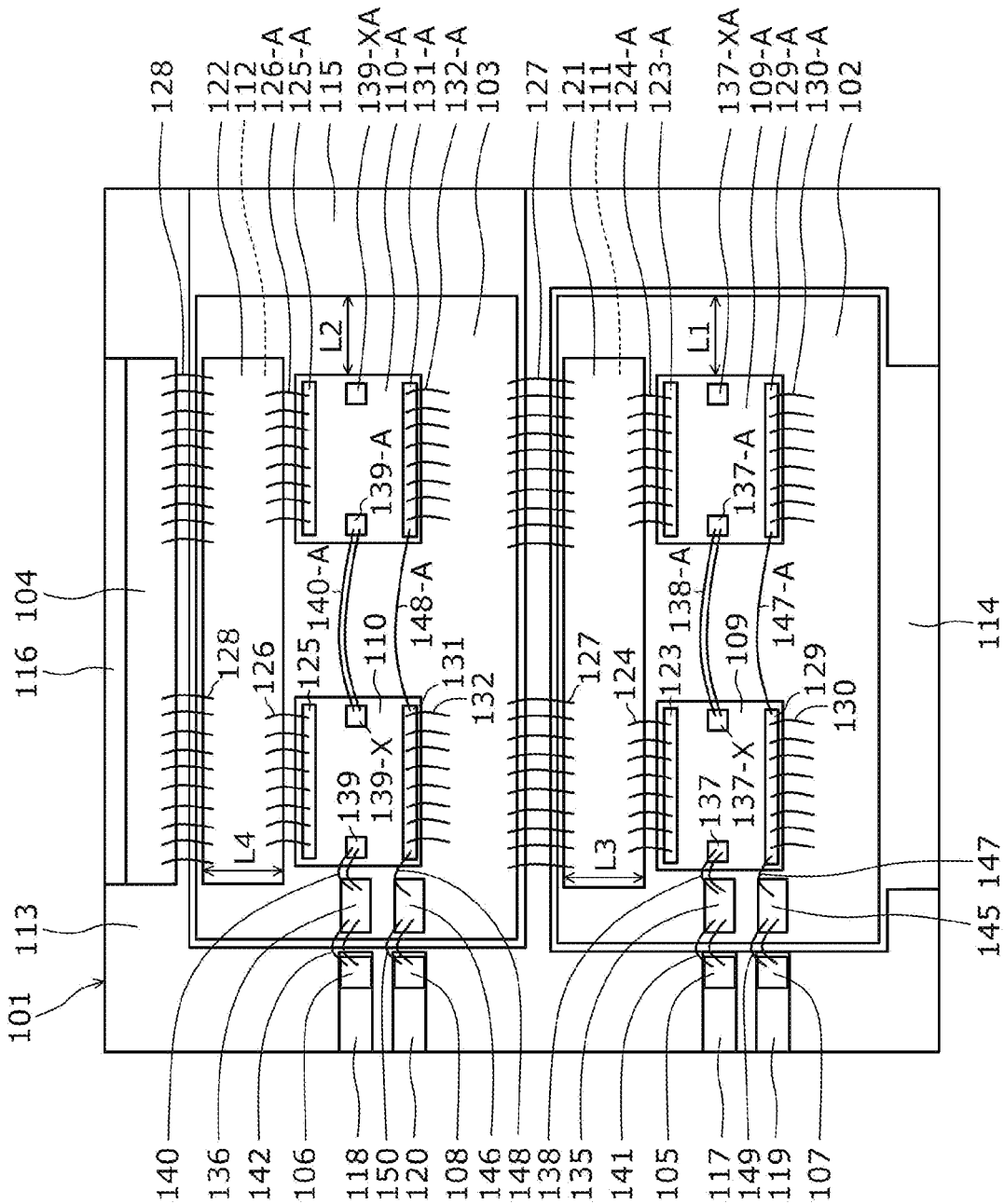
FIG. 2 is a top view of the semiconductor module according to Embodiment 2 of the present invention.

FIG. 2 is a top view of semiconductor module 200 according to Embodiment 2 of the present invention.

With reference to FIG. 2, the main difference from semiconductor module 100 in Embodiment 1 is that two or more semiconductor chips are used for each of first semiconductor chip 109 and second semiconductor chip 110 in Embodiment 1. Embodiment 2 shows an embodiment in which two or more semiconductor chips are used for each of first semiconductor chip 109 and second semiconductor chip 110 in Embodiment 1. It should be noted that FIG. 2 illustrates a case where the number of each of first semiconductor chip 109 and second semiconductor chip 110 in Embodiment 1 is two.

In addition, with respect to first gate electrode pad 137 of first semiconductor chip 109 and first gate electrode pad 139 of second semiconductor chip 110 in FIG. 2, it is easier to connect wirings between a plurality of chips if gate electrode pads on the wiring pattern in the same chip are provided on both sides, so that additional gate electrode pads are provided on first semiconductor chip 109 and second semiconductor chip 110, and X is used at the end of the reference numerals of the additional gate electrode pads.

Furthermore, in the case where each of first semiconductor chip 109 and second semiconductor chip 110 in Embodiment 1 is two in number, A is used at the end of the reference numeral for the other portion corresponding to one portion.

First semiconductor chip 109, first semiconductor chip 109-A, and first intermediate board 111 are bonded onto first metal plate 102. Similarly, second semiconductor chip 110, second semiconductor chip 110-A, and second intermediate board 112 are bonded onto second metal plate 103.

First drain electrode pad 123-A of first semiconductor chip 109-A and first metal film 121 are connected via first wire 124-A.

Similarly, second drain electrode pad 125-A of second semiconductor chip 110-A and second metal film 122 are connected via second wire 126-A.

First source electrode pad 129-A of first semiconductor chip 109-A and first metal plate 102 are connected via wire 130-A.

Similarly, second source electrode pad 131-A of second semiconductor chip 110-A and first metal plate 103 are connected via wire 132-A.

One gate electrode pad 137-X of the gate electrode pads on both sides of first semiconductor chip 109 and one gate electrode pad 137-A of the gate electrode pads on both sides of first semiconductor chip 109-A are connected via wire 138-A.

Similarly, one gate electrode pad 139-X of the gate electrode pads on both sides of second semiconductor chip 110 and one gate electrode pad 139-A of the gate electrode pads on both sides of second semiconductor chip 110-A are connected via wire 140-A.

Source electrode pad 129 of first semiconductor chip 109 and source electrode pad 129-A of first semiconductor chip 109-A are connected via wire 147-A.

Similarly, source electrode pad 131 of second semiconductor chip 110 and source electrode pad 131-A of second semiconductor chip 110-A are connected via wire 148-A.

Since other structures have the same configurations as those in FIG. 1A and FIG. 1B, the description thereof will be omitted. In Embodiment 2, by using two or more semiconductor chips of each of first semiconductor chip 109 and second semiconductor chip 110 of Embodiment 1, high heat dissipation in a semiconductor chip having a smaller area can be achieved.

It should be noted that in order to dissipate heat more efficiently, it is necessary to secure the shortest distance between the chips of first semiconductor chip 109 and first semiconductor chip 109-A to be twice the distance of L1, and to secure the shortest distance between the chips of second semiconductor chip 110 and second semiconductor chip 110-A to be twice the distance of L2.

Embodiment 3

Figure 3A:
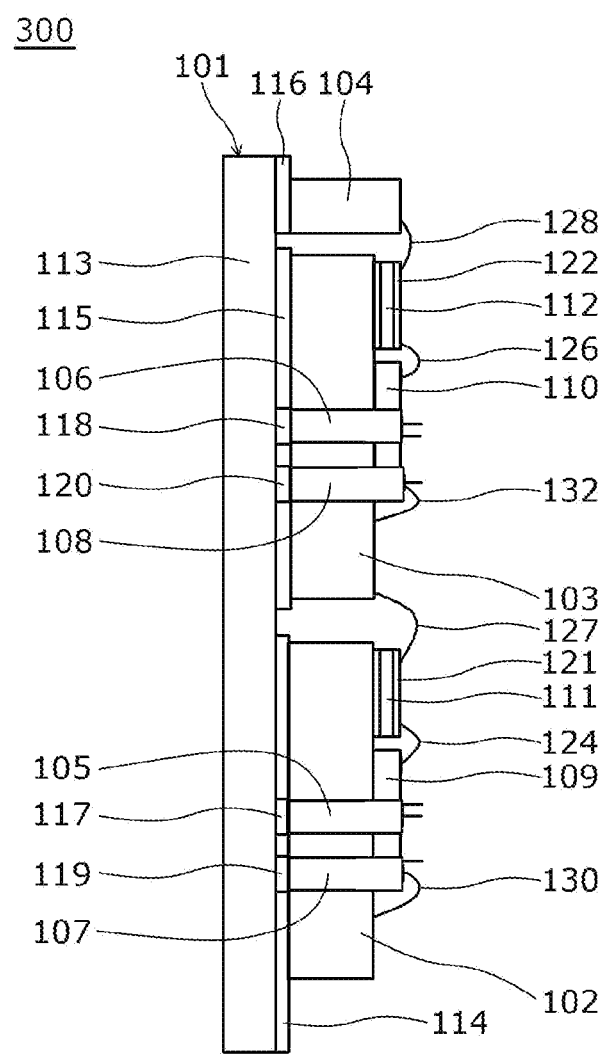
FIG. 3A is a side view of the semiconductor module according to Embodiment 3 of the present invention.
Figure 3B:
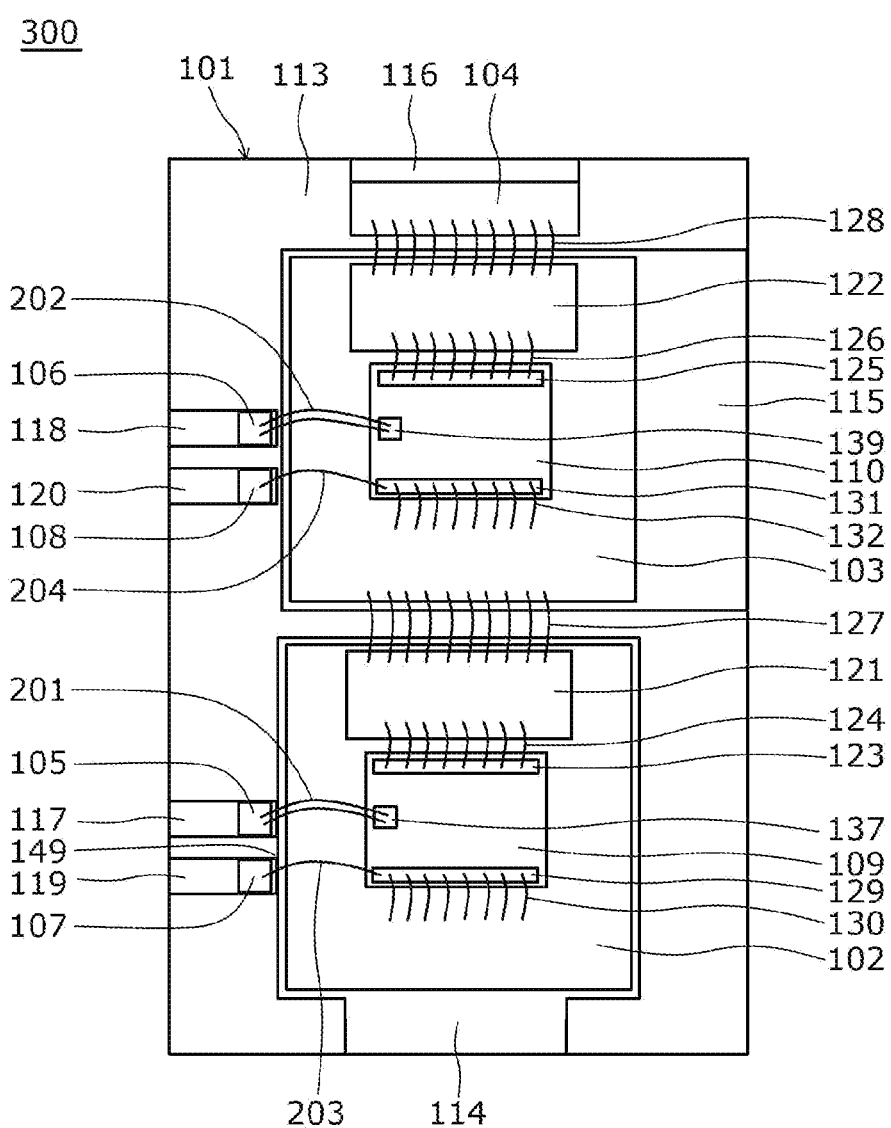
FIG. 3B is a top view of the semiconductor module according to Embodiment 3 of the present invention.

FIG. 3A is a side view of semiconductor module 300 according to Embodiment 3 of the present invention. FIG. 3B is a top view of semiconductor module 300 according to Embodiment 3 of the present invention.

With reference to FIG. 3A and FIG. 3B, the difference from semiconductor module 100 in Embodiment 1 is that the electrical connection from each of the electrode pads of first semiconductor chip 109 and second semiconductor chip 110 to LS gate wiring pattern 117, HS gate wiring pattern 118, LS sense wiring pattern 119, and HS sense wiring pattern 120 is not via a intermediate board (metal film). Specifically, semiconductor module 300 does not have third to sixth intermediate boards 133, 134, 143, and 144 in semiconductor module 100, and fifth wire 201 is connected to first gate electrode pad 137 and fourth metal plate 105, and sixth wire 202 is connected to second gate electrode pad 139 and fifth metal plate 106. In addition, ninth wire 203 is connected to first source electrode pad 129 and sixth metal plate 107, and tenth wire 204 is connected to second source electrode pad 131 and seventh metal plate 108. In the improvement of the high frequency characteristics of half bridge circuits, measures for gate and sense wiring lines have a lower priority than power lines. Embodiment 3 is described as an example for that purpose.

Embodiment 4

Figure 4:
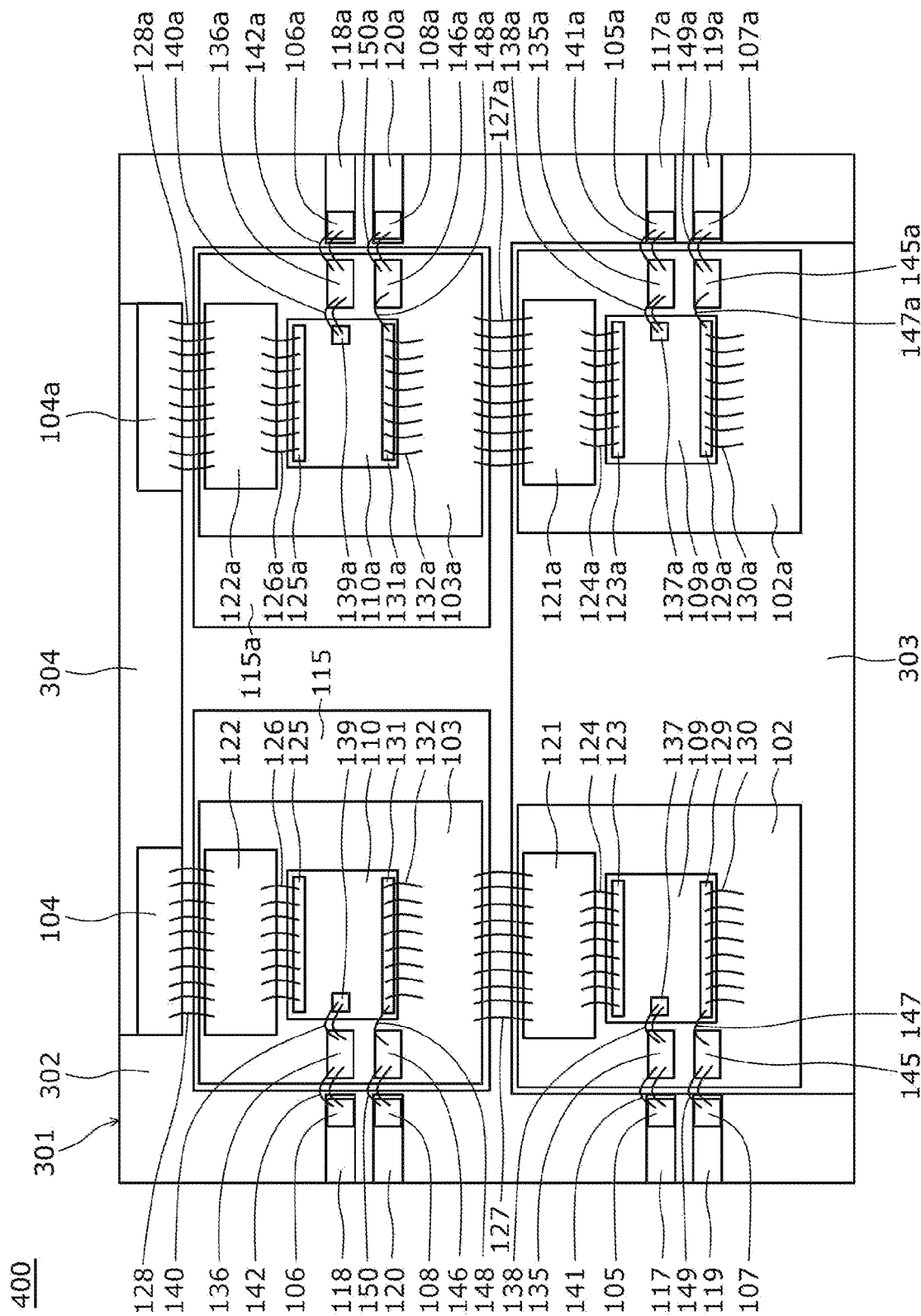
FIG. 4 is a top view of the semiconductor module according to Embodiment 4 of the present invention.

FIG. 4 is a top view of semiconductor module 400 according to Embodiment 4 of the present invention.

With reference to FIG. 4, the basic configuration is a configuration in which two sets of the half bridge circuit configurations in FIG. 1A and FIG. 1B are arranged on the same board main body. Specifically, semiconductor module 400 includes heat dissipation board 301 that is larger than heat dissipation board 101 of semiconductor module 100, and has a configuration such that the half bridge circuit configuration of Embodiment 1 is symmetrically arranged side by side on board main body 302 of heat dissipation board 301. However, since the third wiring pattern connected to the power supply of the power line and the first wiring pattern connected to the ground of the power line need to be handled in common, they are treated as single components in the figure. Specifically, semiconductor module 400 includes single first wiring pattern 303 and single third wiring pattern 304 that are commonly used in two sets of half bridge circuits.

It should be noted that regarding the full bridge circuit configuration, detailed description will be omitted by using a at the end of the numerical references of the corresponding portions of the half bridge circuit configuration of Embodiment 1.

Embodiment 5

Figure 5:
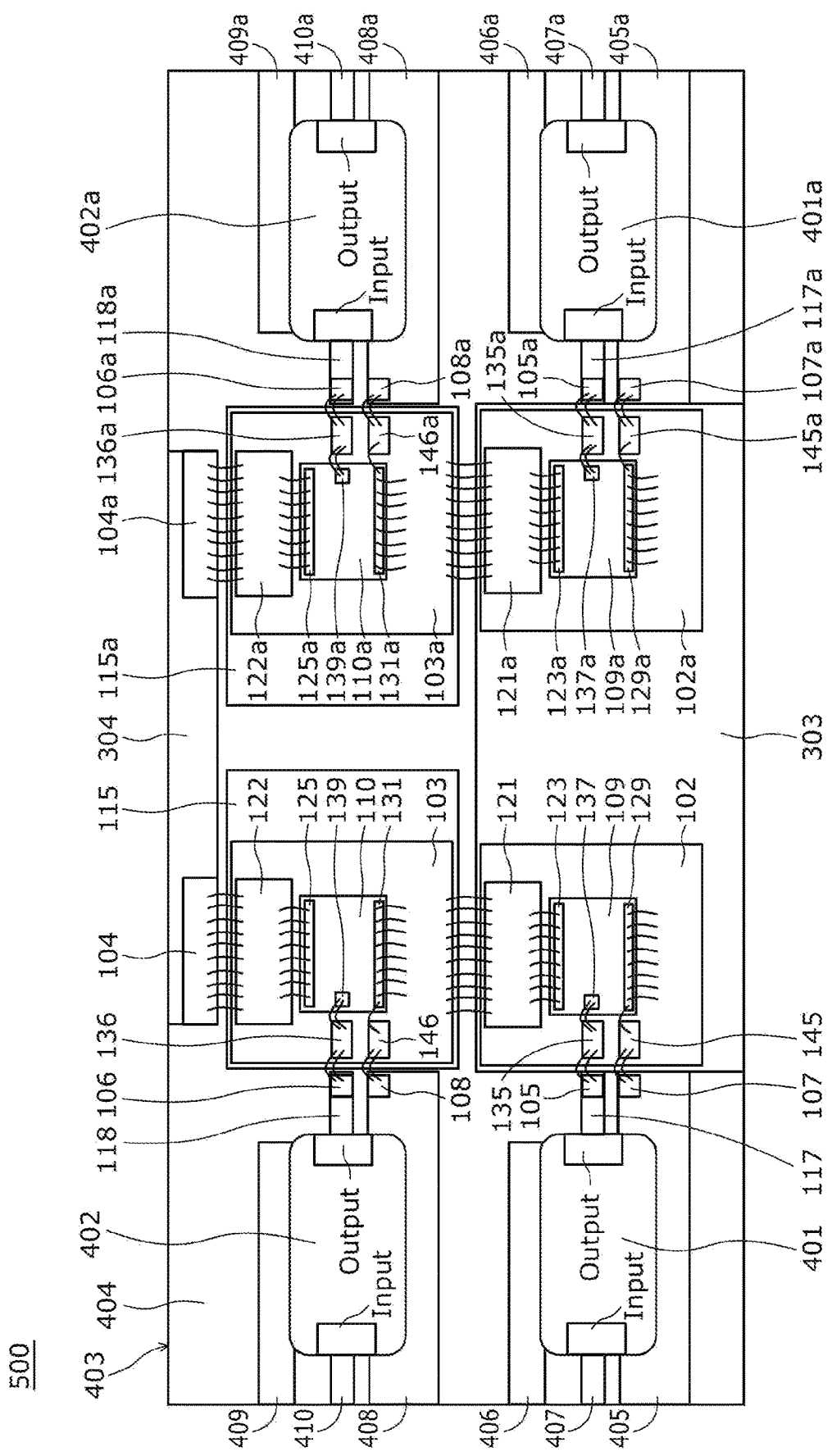
FIG. 5 is a top view of the semiconductor module according to Embodiment 5 of the present invention.

FIG. 5 is a top view of semiconductor module 500 according to Embodiment 5 of the present invention.

With reference to FIG. 5, the basic configuration is a configuration in which a drive circuit is added to the full bridge circuit configuration in FIG. 4; drive circuits 401, 402, 401a, and 402a are provided between the respective gate and source (sense) of first semiconductor chip 109, second semiconductor chip 110, first semiconductor chip 109a, and second semiconductor chip 110a; and individual power supply wirings are provided in each of drive circuits 401, 402, 401a, and 402a. Specifically, semiconductor module 500 includes heat dissipation board 403 that is larger than heat dissipation board 301 of semiconductor module 400, and has a full bridge circuit configuration of Embodiment 4 and drive circuits 401, 402, 401a, and 402a arranged on board main body 404 of heat dissipation board 403. Drive circuit 401 is connected to LS gate wiring pattern 117, LS sense wiring pattern 405, LS drive circuit power supply wiring pattern 406, and LS drive signal input wiring pattern 407. Drive circuit 402 is connected to HS gate wiring pattern 118, HS sense wiring pattern 408, HS drive circuit power supply wiring pattern 409, and HS drive signal input wiring pattern 410. Since drive circuit 401a is connected to wiring patterns which are symmetrically arranged side by side with LS gate wiring pattern 117, LS sense wiring pattern 405, LS drive circuit power supply wiring pattern 406, and LS drive signal input wiring pattern 407, detailed description will be omitted by using a at the end of the reference numerals of the corresponding portions. Since drive circuit 402a is connected to wiring patterns which are symmetrically arranged side by side with HS gate wiring pattern 118, HS sense wiring pattern 408, HS drive circuit power supply wiring pattern 409, and HS drive signal input wiring pattern 410, detailed description will be omitted by using a at the end of the reference numerals of the corresponding portions. The drive circuit referred to here is a driver circuit unit that converts an input signal so that it can be sufficiently gate-driven; a circuit that shapes the waveform of the driver circuit output; and a circuit that includes a power supply terminal for operating these, and a bypass capacitor for removing noise from the power supply, or a circuit in which a part thereof is integrated. It should be noted that although this drawing illustrates the full bridge circuit configuration, a configuration in which a drive circuit is added in the half bridge circuit configuration also belongs to the embodiment of the present invention.

Embodiment 6

Figure 6:
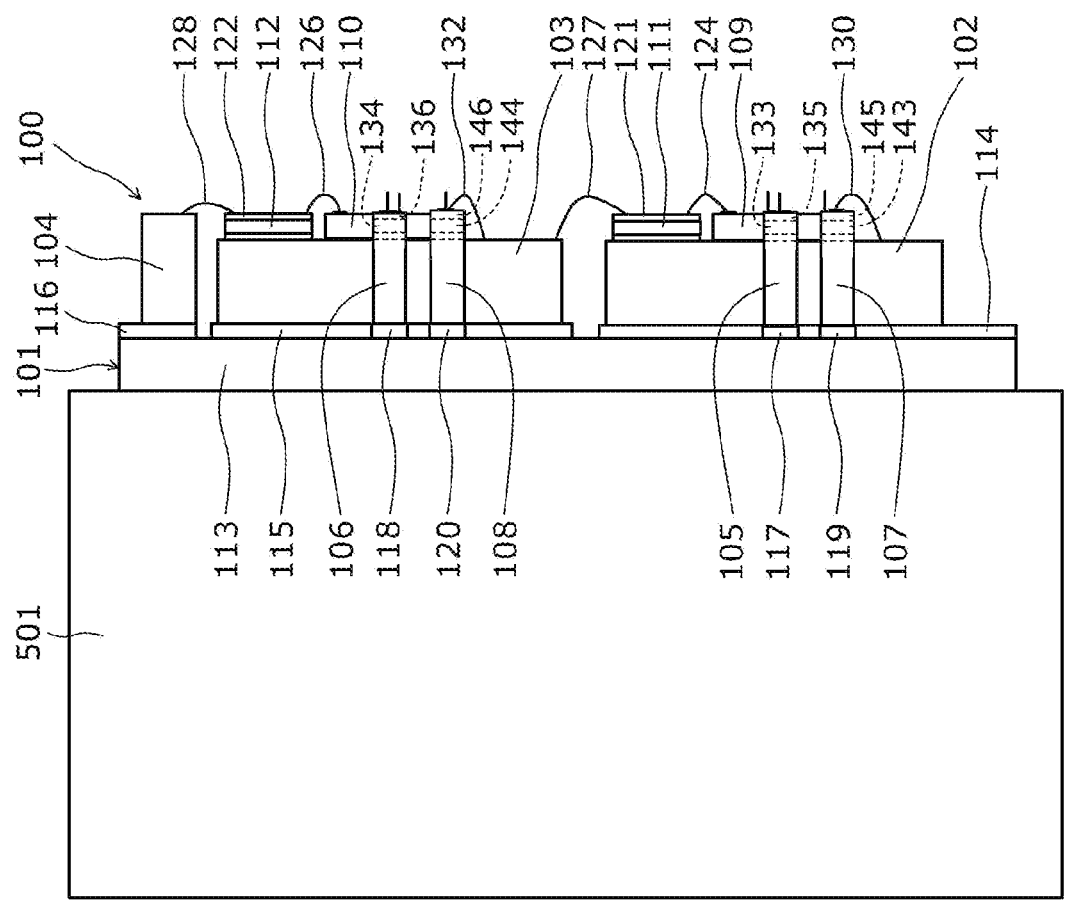
FIG. 6 is a side view of the power semiconductor module according to Embodiment 6 of the present invention.

FIG. 6 is a side view of power semiconductor module 600 according to Embodiment 6 of the present invention.

With reference to FIG. 6, power semiconductor module 600 includes semiconductor module 100 and cooling heat sink 501 bonded to the lower surface of heat dissipation board 101. In this way, semiconductor module 100 can be used to implement power semiconductor module 600. It should be noted that semiconductor modules 200, 300, 400, and 500 shown in FIG. 2 to FIG. 5 can also be used to implement power semiconductor modules in the same manner.

In addition, the power electronic equipment, in which semiconductor modules 100, 200, 300, 400, and 500 shown in FIG. 1A to FIG. 5 and power semiconductor module 600 shown in FIG. 6 of the present invention are used, includes a high frequency power supply or the like incorporated in a semiconductor manufacturing device, a $CO_2$ laser device, or the like.

In the above-described embodiment, the case where semiconductor modules 100, 200, 300, 400, and 500 include third to seventh metal plates 104, 105, 106, 107, and 108 has been described, but the present invention is not limited thereto. The semiconductor module may not include the third to seventh metal plates.

INDUSTRIAL APPLICABILITY

The semiconductor module for the power electronics and the power electronic equipment using the semiconductor module according to the present invention can achieve high heat dissipation and good improvement of high frequency characteristics, and contribute to high power and high speed operation in the field of use, so that the demand is expected to increase. An example of power electronic equipment is a high frequency power source or the like incorporated in a semiconductor manufacturing device, a $CO_2$ laser device, or the like.

The invention claimed is:

1. A semiconductor module, comprising:
a heat dissipation board that is insulating and includes, on an upper surface of the heat dissipation board, at least a first wiring pattern, a second wiring pattern, and a third wiring pattern each of which is a conductor layer;
a first metal plate that is bonded onto the first wiring pattern;
a second metal plate that is bonded onto the second wiring pattern;
a first semiconductor chip and a first intermediate board that are bonded onto the first metal plate; and
a second semiconductor chip and a second intermediate board that are bonded onto the second metal plate,
wherein a first metal film electrically insulated from the first metal plate is disposed on an upper surface of the first intermediate board,
a second metal film electrically insulated from the second metal plate is disposed on an upper surface of the second intermediate board,
at least one first drain electrode pad of the first semiconductor chip is connected to the first metal film disposed on the upper surface of the first intermediate board by a plurality of first wires,
at least one second drain electrode pad of the second semiconductor chip is connected to the second metal film disposed on the upper surface of the second intermediate board by a plurality of second wires,
the first metal film is connected to the second metal plate via a plurality of third wires,
the second metal film is connected to the third wiring pattern via a plurality of fourth wires, and
the semiconductor module configures a half bridge circuit.

2. The semiconductor module according to claim 1,
wherein when dielectric constant $\varepsilon i1$ of an insulator included in the first intermediate board is lower than dielectric constant $\varepsilon s1$ of a substrate of the first semiconductor chip, and
dielectric constant $\varepsilon i2$ of an insulator included in the second intermediate board is lower than dielectric constant $\varepsilon s2$ of a substrate of the second semiconductor chip, $$(\varepsilon i1/di1)<(\varepsilon s1/ds1),$$

and $$(\varepsilon i2/di2)<(\varepsilon s2/ds2)$$

are satisfied,
where di1 denotes a thickness of the first intermediate board,
di2 denotes a thickness of the second intermediate board,
ds1 denotes a thickness of the first semiconductor chip, and
ds2 denotes a thickness of the second semiconductor chip.

3. The semiconductor module according to claim 1, further comprising:
a third metal plate that is bonded onto the third wiring pattern,
wherein the plurality of fourth wires are connected to the third metal plate.

4. The semiconductor module according to claim 3,
wherein a height of the third metal plate is greater than thickness T2 of the second metal plate, and is less than a sum of thickness T2 of the second metal plate and twice a thickness of the second intermediate board.

5. The semiconductor module according to claim 1,
wherein a relationship between shortest distance L1 from an end of the first semiconductor chip to an end of the first metal plate and thickness T1 of the first metal plate is L1>T1, and
a relationship between shortest distance L2 from an end of the second semiconductor chip to an end of the second metal plate and thickness T2 of the second metal plate is L2>T2.

6. The semiconductor module according to claim 5,
wherein thickness T1 of the first metal plate is thinner than maximum width L3 of the first intermediate board in an extension direction of the plurality of first wires and the plurality of third wires in a plan view, and
thickness T2 of the second metal plate is thinner than maximum width L4 of the second intermediate board in an extension direction of the plurality of second wires and the plurality of fourth wires in a plan view.

7. The semiconductor module according to claim 1,
wherein a channel of the first semiconductor chip extends in a direction parallel to a substrate of the first semiconductor chip, and
a channel of the second semiconductor chip extends in a direction parallel to a substrate of the second semiconductor chip.

8. The semiconductor module according to claim 7,
wherein the first semiconductor chip and the second semiconductor chip each include a GaN transistor.

9. The semiconductor module according to claim 1,
wherein a total number of the plurality of third wires is larger than a total number of the plurality of first wires, and
a total number of the plurality of fourth wires is larger than a total number of the plurality of second wires.

10. The semiconductor module according to claim 1,
wherein a component bonded to the first metal plate and a component bonded to the second metal plate are all bonded using an identical solder material.

11. The semiconductor module according to claim 10,
wherein the solder material is AuSn.

12. The semiconductor module according to claim 1,
wherein both of the bonding between the first wiring pattern and the first metal plate and the bonding between the second wiring pattern and the second metal plate are performed with a solder material of AuSn.

13. The semiconductor module according to claim 1,
wherein at least one fifth wire connected from a first gate electrode pad of the first semiconductor chip is electrically connected to a low side gate wiring pattern of the half bridge circuit which is a conductor layer on the upper surface of the heat dissipation board via a fourth metal plate, and
at least one sixth wire connected from a second gate electrode pad of the second semiconductor chip is electrically connected to a high side gate wiring pattern of the half bridge circuit which is a conductor layer on the upper surface of the heat dissipation board via a fifth metal plate.

14. The semiconductor module according to claim 13, further comprising:
a third intermediate board that is bonded onto the first metal plate; and
a fourth intermediate board that is bonded onto the second metal plate,
wherein a third metal film electrically insulated from the first metal plate is disposed on an upper surface of the third intermediate board,
a fourth metal film electrically insulated from the second metal plate is disposed on an upper surface of the fourth intermediate board,
the first gate electrode pad is electrically connected to the third metal film that is disposed on the upper surface of the third intermediate board by the at least one fifth wire,
the second gate electrode pad is electrically connected to the fourth metal film that is disposed on the upper surface of the fourth intermediate board by the at least one sixth wire,
the third metal film disposed on the upper surface of the third intermediate board is electrically connected to the fourth metal plate by at least one seventh wire,
the fourth metal film disposed on the upper surface of the fourth intermediate board is electrically connected to the fifth metal plate by at least one eighth wire,
the fourth metal plate is connected to the low side gate wiring pattern on the upper surface of the heat dissipation board, and
the fifth metal plate is connected to the high side gate wiring pattern on the upper surface of the heat dissipation board.

15. The semiconductor module according to claim 13,
wherein the fourth metal plate is arranged in a direction in which a distance from an end of the first metal plate to the first gate electrode pad of the first semiconductor chip that is to be electrically connected is shortest when seen from the first gate electrode pad, and
the fifth metal plate is arranged in a direction in which a distance from an end of the second metal plate to the second gate electrode pad of the second semiconductor chip that is to be electrically connected is shortest when seen from the second gate electrode pad.

16. The semiconductor module according to claim 1,
wherein at least one ninth wire connected from a first source electrode pad of the first semiconductor chip is electrically connected to a low side sense wiring pattern which is a conductor layer on the upper surface of the heat dissipation board via a sixth metal plate, and
at least one tenth wire connected from a second source electrode pad of the second semiconductor chip is electrically connected to a high side sense wiring pattern which is a conductor layer on the upper surface of the heat dissipation board via a seventh metal plate.

17. The semiconductor module according to claim 16, further comprising:
a fifth intermediate board that is bonded onto the first metal plate; and
a sixth intermediate board that is bonded onto the second metal plate,
wherein a fifth metal film electrically insulated from the first metal plate is disposed on an upper surface of the fifth intermediate board,
a sixth metal film electrically insulated from the second metal plate is disposed on an upper surface of the sixth intermediate board,
at least one of first source electrode pads each of which is the first source electrode pad of the first semiconductor chip is electrically connected to the fifth metal film that is disposed on the upper surface of the fifth intermediate board by the at least one ninth wire,
at least one of second source electrode pads each of which is the second source electrode pad of the second semiconductor chip is electrically connected to the sixth metal film that is disposed on the upper surface of the sixth intermediate board by the at least one tenth wire, the fifth metal film disposed on the upper surface of the fifth intermediate board is electrically connected to the sixth metal plate by at least one eleventh wire, the sixth metal film disposed on the upper surface of the sixth intermediate board is electrically connected to the seventh metal plate by at least one twelfth wire, the sixth metal plate is connected to the low side sense wiring pattern on the upper surface of the heat dissipation board, and the seventh metal plate is connected to the high side sense wiring pattern on the upper surface of the heat dissipation board.

18. The semiconductor module according to claim 16, wherein the sixth metal plate is arranged in a direction in which a distance from an end of the first metal plate to the first source electrode pad of the first semiconductor chip that is to be electrically connected is shortest when seen from the first source electrode pad, and the seventh metal plate is arranged in a direction in which a distance from an end of the second metal plate to the second source electrode pad of the second semiconductor chip that is to be electrically connected is shortest when seen from the second source electrode pad.

19. The semiconductor module according to claim 1, wherein a material of all of the plurality of wires is gold.

20. The semiconductor module according to claim 1, wherein a material of an upper surface of each of the first drain electrode pad, the first gate electrode pad of the first semiconductor chip, the first source electrode pad of the first semiconductor chip, the second drain electrode pad, the second gate electrode pad of the second semiconductor chip, and the second source electrode pad of the second semiconductor chip is gold.

21. The semiconductor module according to claim 1, wherein a material of an upper surface of the first metal plate and an upper surface of the second metal plate and a material of an upper surface of the first metal film and an upper surface of the second metal film are gold.

22. The semiconductor module according to claim 1, wherein the semiconductor module configures a full bridge circuit using two sets of half bridge circuits on the heat dissipation board, each of the half bridge circuits being the half bridge circuit.

23. The semiconductor module according to claim 1, wherein two gate drive circuits in the half bridge circuit are integrated on the heat dissipation board.

24. A power semiconductor module, comprising:

the semiconductor module according to claim 1; and a cooling heat sink bonded to a lower surface of the heat dissipation board.

25. Power electronic equipment using the semiconductor module according to claim 1.

* * * * *